United States Patent
Vinke et al.

(10) Patent No.: US 7,266,021 B1
(45) Date of Patent: Sep. 4, 2007

(54) LATCH-BASED RANDOM ACCESS MEMORY (LBRAM) TRI-STATE BANKING ARCHITECTURE

(75) Inventors: David Vinke, Clackamas, OR (US); Bret A. Oeltjen, Elko, MN (US); Ekambaram Balaji, Portland, OR (US)

(73) Assignee: LSI Corporation, Milpitas, CA (US)

( * ) Notice: Subject to any disclaimer, the term of this patent is extended or adjusted under 35 U.S.C. 154(b) by 42 days.

(21) Appl. No.: 11/237,064

(22) Filed: Sep. 27, 2005

(51) Int. Cl.
 *G11C 7/00* (2006.01)
 *G11C 8/00* (2006.01)

(52) U.S. Cl. ............... 365/189.05; 365/189.08; 365/230.03; 365/230.08

(58) Field of Classification Search ............ 365/189.05, 365/189.08, 203.03, 230.08
See application file for complete search history.

(56) References Cited

U.S. PATENT DOCUMENTS

| | | | | |
|---|---|---|---|---|
| 5,555,209 A | * | 9/1996 | Smith et al. | 365/189.05 |
| 5,729,764 A | * | 3/1998 | Sato | 365/189.05 |
| 5,818,786 A | * | 10/1998 | Yoneda | 365/230.03 |
| 5,926,424 A | * | 7/1999 | Abe | 365/189.05 |
| 6,134,178 A | * | 10/2000 | Yamazaki et al. | 365/230.03 |
| 6,173,379 B1 | * | 1/2001 | Poplingher et al. | 365/230.03 |
| 6,256,253 B1 | * | 7/2001 | Oberlaender et al. | 365/230.03 |
| 6,282,149 B1 | * | 8/2001 | Pittau | 365/230.03 |
| 6,813,213 B2 | * | 11/2004 | Nagata et al. | 365/230.03 |
| 6,853,589 B2 | * | 2/2005 | Tojima et al. | 365/189.05 |

* cited by examiner

*Primary Examiner*—Trong Phan
(74) *Attorney, Agent, or Firm*—Daffer McDaniel, LLP

(57) ABSTRACT

A disclosed memory, such as a random access memory (RAM) has multiple banks including a first bank and a second bank each having multiple latch cells configured to store data. The first bank has a first bit line, and the second bank has a second bit line. A first tri-state buffer has an input node coupled to the first bit line, an enable node coupled to receive a first enable signal, and an output node coupled to a tri-state output bit line. A second tri-state buffer has an input node coupled to the second bit line, an enable node coupled to receive a second enable signal, and an output node coupled to the tri-state output bit line. Enable signal generation logic uses a portion of an address signal to generate the first and second enable signals. The memory produces an output signal dependent upon the enable signal generation logic output, and thus upon a logic level of the tri-state output bit line.

20 Claims, 7 Drawing Sheets

LATCH-BASED RANDOM ACCESS MEMORY (LBRAM) TRI-STATE BANKING ARCHITECTURE

RELATED APPLICATIONS

This application relates to co-pending application, Ser. No. 11/237,059 filed Sep. 27, 2005, entitled "LATCH-BASED RAND0M ACCESS MEMORY (LBRAM) WITH TRI-STATE BANKING AND IMPLEMENTING CONTENTION AVOIDANCE," by David Vinke, Bret A. Oeltjen, and Michael N. Dillon, which is incorporated herein by reference in its entirety.

BACKGROUND OF THE INVENTION

1. Field of the Invention

This invention relates to data storage devices, and more particularly to a memory device that can utilize latch cells and tri-state buffering of bit lines depending on enable signals produced from a portion of an address signal.

2. Description of the Related Art

There is increased use of memories in application specific integrated circuits (ASICs) today, and the trend is for even more memory use per ASIC. There is also a trend for increased use of small memories which are often implemented as latch-based random access memories (LBRAMS). Key issues with LBRAMs include performance and required die area.

A common method to implement memories on ASICs is to use static random access memories (SRAMs) that include an array of bit cells surrounded by logic to read data from, and write data to, the bit cells. In general, SRAM bit cells are organized in groups such that all bit cells in a group are connected to a pair of bit lines. The bit lines are used to write data to the bit cells and to read data from the bit cells. Typically, special sense amplifiers are used to sense small voltage swings on the bit lines to determine whether the bit cell is storing a logic 1 or a logic 0. Using a small voltage swing has the advantage of allowing a smaller bit cell and faster read times. However, the area overhead associated with the sense amplifiers can be a large drawback for small memories. Furthermore, SRAMs are susceptible to many more defects than standard logic and so require special built-in self test (BIST) test logic to test for defects. For smaller memories the die areas required to implement the BIST logic may be larger than the memory itself.

Due to the relatively large die areas required by SRAMs, small memories are often implemented as LBRAMs. A typical LBRAM includes an array of latch cells surrounded by logic to read data from, and write data to, the latch cells. The latch cells are typically organized into groups with all latch cells in a group connected to a common bit line. Unlike SRAM bit lines, latch cell bit lines use standard logic 1 and logic 0 voltage levels. As a result, standard logic can be connected directly to the bit lines to read the data. This reduces the area overhead to implement the memory, and for small memories the area of an LBRAM is much smaller than a comparable SRAM.

The main drawback with using full voltage swings on the bit lines is that transitions from one logic level to another take longer, negatively impacting memory performance. As a result of the slow transitions, known LBRAMs are often slower than, or at best match the performance of, comparable SRAMs. However, as latch cells are quite similar to standard logic, and full voltage swings are used on the bit lines, LBRAMs are not susceptible to any more defects than standard logic cells, and the BIST logic overhead required with SRAMs can be avoided. For example, LBRAMs can be smaller than comparable SRAMs at memory sizes up to 8 K total data bits.

It would be beneficial to have a random access memory (RAM) structure that has a read access time that is sufficiently less than known LBRAM structures and/or requires a smaller die area than known LBRAM structures.

SUMMARY OF THE INVENTION

A disclosed random access memory (RAM) has multiple banks including a first bank and a second bank each having multiple latch cells configured to store data. The first bank has a first bit line, and the second bank has a second bit line. A first tri-state buffer has an input node coupled to the first bit line, an enable node coupled to receive a first enable signal, and an output node coupled to a tri-state bit line. A second tri-state buffer has an input node coupled to the second bit line, an enable node coupled to receive a second enable signal, and an output node coupled to the tri-state bit line. Enable signal generation logic uses a portion of an address signal to generate the first and second enable signals. The RAM produces an output signal dependent upon a logic level of the tri-state bit line.

BRIEF DESCRIPTION OF THE DRAWINGS

Other objects and advantages of the invention will become apparent upon reading the following detailed description and upon reference to the accompanying drawings in which.

Figure 1:
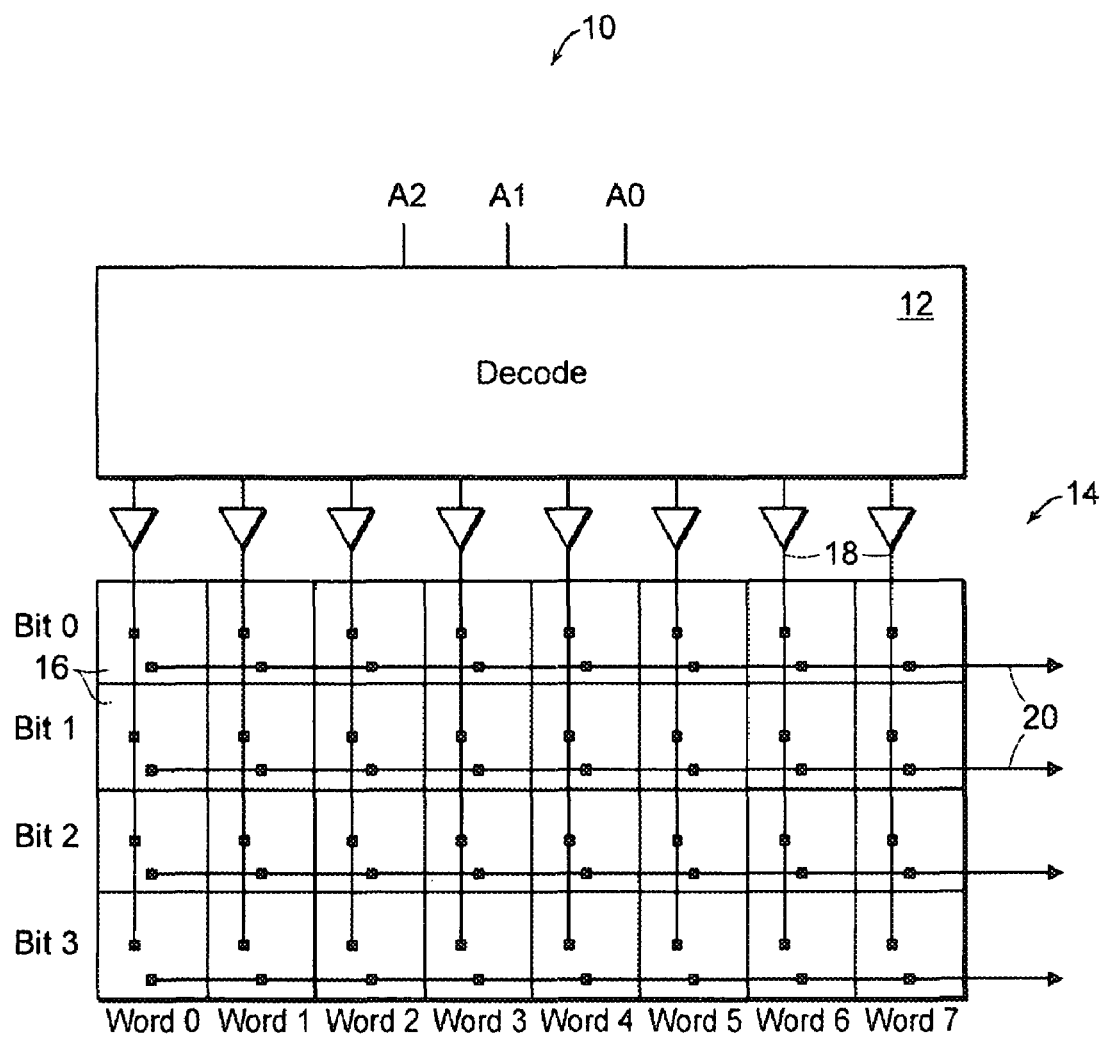
FIG. 1 is a diagram of a portion of a 8×4 latch-based random access memory (LBRAM)

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

FIG. 1 is a diagram of a portion of a conventional 8×4 latch-based random access memory (LBRAM) 10. The conventional LBRAM 10 has a decode unit 12 coupled to a latch array 14. The latch array 14 includes a two-dimensional array of latch cells 16, wherein each of the latch cells 16 includes a latch. The latch array 14 has 8 word lines 18 and 4 bit lines 20. The decode unit 12 receives a 3-bit address signal including address bits A2, A1, and A0. The address bits A2, A1, and A0 are ordered, wherein address bit A2 is the highest-ordered address bit, and the address bit A0 is the lowest-ordered address bit. The decode unit 12 is coupled to the 8 word lines of the latch array 14, and activates one of the word lines 18 according to the 3-bit address signal.

In the LBRAM 10 of FIG. 1 the latch cells 16 of the latch array 14 are grouped by bit number (Bit 0-3) in rows, and by word number (Word 0-7) in columns. Each of the latch cells 16 in each row has an output connected to a corresponding one of the bit lines 20. Each of the latch cells 16 in each column is activated when the corresponding word line is activated, and drives the corresponding bit line with a data value stored by the latch. Accordingly, only one of the latch cells 16 drives each of the bit lines 20 at any given time.

The use of full voltage swings (i.e., in excess of 1.5 volts, or possibly as little as 1.0 volts) on the bit lines 20 causes transitions from one logic level to the other to be relatively slow, negatively impacting performance of the LBRAM 10. In addition, electrical loading on each of the bit lines 20 also slows signal transitions. One of the latch cells 16 connected to each of the bit lines 20 is active and drives the bit line, while the other latch cells 16 connected to the bit line are inactive. The amount of time required for signals on the bit lines 20 to transition from one logic level to the other is determined by the ability of the latch cells 16 to drive the bit lines 20.

In general, the electrical loading on each of the bit lines 20 has two parts: a gate load from the inactive latch cells 16 with outputs connected to the bit line, and a wire load from the conductor (e.g., metal interconnect) forming the bit line. One problem with the LBRAM 10 of FIG. 1 is that as the number of latch cells 16 is increased, the electrical loading on each of the bit lines 20 increases proportionally, and performance falls off quickly.

Figure 2:
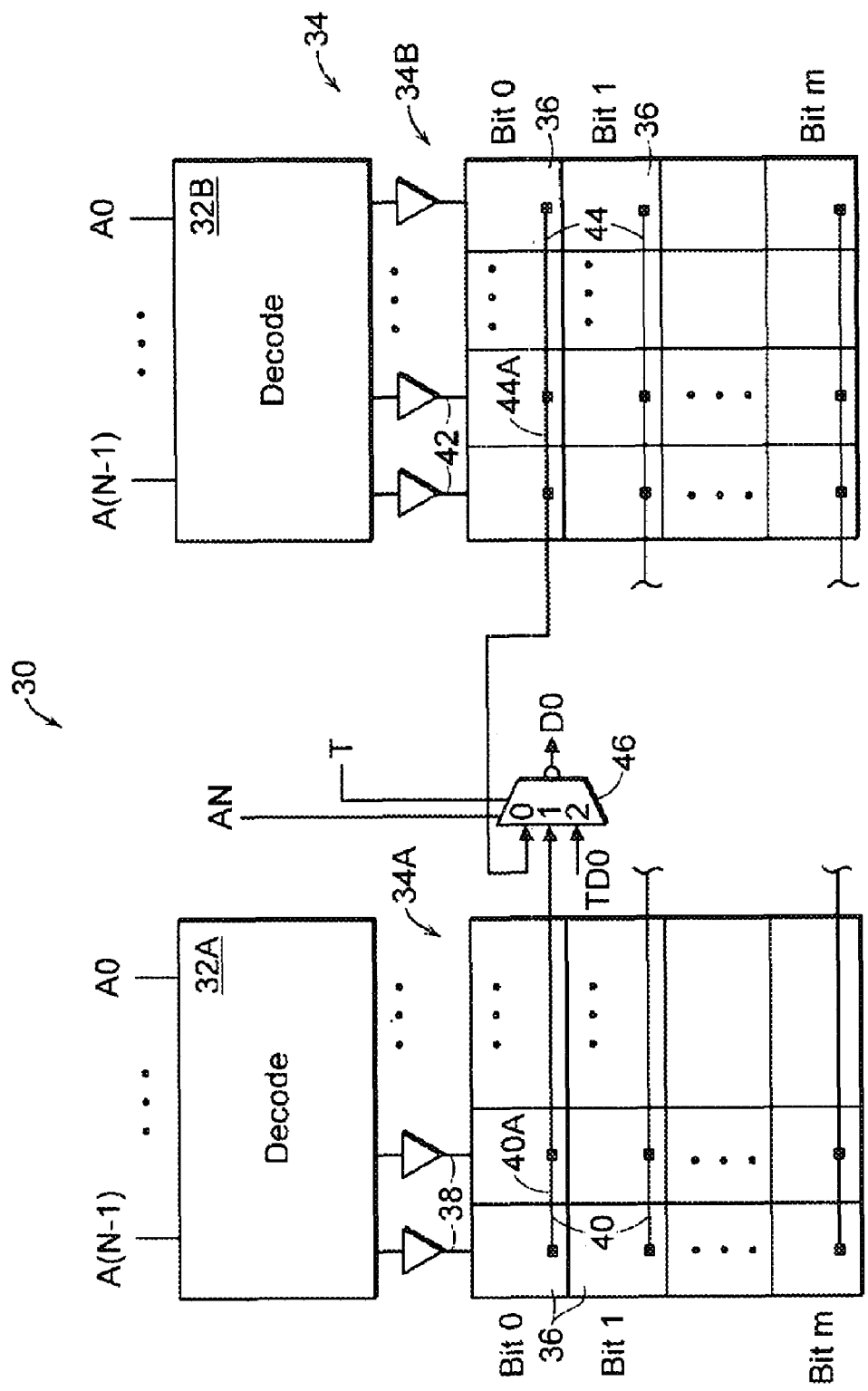
FIG. 2 is a diagram of one embodiment of an LBRAM having a latch array divided into 2 banks according to a multiplexer (mux) banking architecture.

FIG. 2 is a diagram of one embodiment of a $2^n \times m$ LBRAM 30 having a latch array 34 divided into 2 banks 34A and 34B, wherein bit lines (Bit 0-m) of each of the banks 34A and 34B are relatively short and signal transitions on the bit lines occur more quickly. Each of the banks 34A and 34B includes a two-dimensional array of latch cells 36, wherein each of the latch cells 36 includes a latch. The bank 34A has $2^{n-1}$ word lines 38 and m bit lines 40. The similar bank 34B also has $2^{n-1}$ word lines 42 and m bit lines 44. The LBRAM 30 has 2 decode units 32A and 32B, each receiving the (n−1) highest-ordered bits of an n-bit address signal A(N−1) . . . A0).

The latch cells 36 of each of the banks 34A and 34B may be grouped by bit number in rows, and by word number in columns. Each of the latch cells 36 in each row of the bank 34A has an output connected to a corresponding one of the bit lines 40, and each of the latch cells 36 in each row of the bank 34B has an output connected to a corresponding one of the bit lines 44. Each of the latch cells 36 in each column of the bank 34A is activated when the corresponding one of the word lines 38 is activated, and drives the corresponding one of the bit lines 40 with a data value stored by the latch. Similarly, each of the latch cells 36 in each column of the bank 34B is activated when the corresponding one of the word lines 42 is activated, and drives the corresponding one of the bit lines 44 with a data value stored by the latch.

The decode unit 32A is coupled to the $2^{n-1}$ word lines 38 of the bank 34A, and the decode unit 32B is coupled to the $2^{n-1}$ word lines 42 of the bank 34B. The decode unit 32A activates the word lines 38 of the bank 34A according to the (n−1) lowest-ordered bits of the n-bit address signal A, and the decode unit 32B activates the word lines 42 of the bank 34B according to the (n−1) lowest-ordered bits of the n-bit address signal A. Although a separate decode unit is required for each of the banks 34A and 34B, each of the decode units 32A and 32B decodes only half the total number of words in the LBRAM 30.

In the embodiment of FIG. 2, the LBRAM 30 includes m multiplexers having input nodes connected to corresponding bit lines of the banks 34A and 34B. Each of the m multiplexers receives the highest-ordered bit AN of the n-bit address signal A at a control node, and uses the address bit AN to select between logic signals on the corresponding bit lines. Each of the m multiplexers also receives a corresponding bit of a test data signal TD at a third input node, and a test signal T at a second control node. As indicated in FIG. 2, each of the multiplexers performs a logic inversion function. When the test signal T is active or asserted, each of the m multiplexers produces the logical complement of the corresponding bit of the test data signal TD at an output node.

One of the m multiplexers (muxes) of the LBRAM 30 is shown in FIG. 2 and labeled 46. In the embodiment of FIG. 2, the multiplexer (mux) 46 is a 3:1 mux in order to facilitate a test mode. In other embodiments, the mux 46 may be a 2:1 mux. The mux 46 has an input node coupled to the corresponding bit line 40A of the bank 34A, another input node coupled to the corresponding bit line 44A of the bank 34B, and a third input node coupled to receive a bit TD0 of the test data signal TD. The mux 46 has a control node coupled to receive the highest-ordered bit AN of the n-bit address signal A, and another control node coupled to receive the test signal T. When the test signal T is active or asserted, the mux 46 produces the logical complement of the corresponding bit TD0 at the output node as an output signal D0. When the test signal T is inactive or deasserted, the mux 46 produces the logical complement of either a signal on the corresponding bit line 40A of the bank 34A, or the logical complement of a signal on the corresponding bit line 44A of the bank 34B, as the output signal D0 is dependent upon a logic value of the address bit AN.

In the LBRAM 30 of FIG. 2, the m bit lines 40 and 44 in the respective banks 34A and 34B are not coupled directly, but are coupled through the m muxes including the mux 46. The advantage of this approach is that fewer latch cells are connected to the bit lines 40 and 44, and the bit lines 40 and 44 are shorter than they would otherwise be. As a result, both gate loading and wire loading on the bit lines 40 and 44 are reduced over the loadings on the bit lines 20 of the LBRAM 10 of FIG. 1, allowing the signal transition times on the bit lines 40 and 44 to be significantly faster than on the bit lines 20.

Typically, the banks 34A and 34B are positioned close to one another on a surface of a semiconductor substrate, and the m muxes including the mux 46 are positioned between the two banks 34A and 34B. The decode unit 32A is positioned near the bank 34A, and the decode unit 32B is positioned near the bank 34B. LBRAMs with larger numbers of banks can easily be implemented using the mux banking architecture of FIG. 2.

In general, the reduction in signal transition times on bit lines achieved by dividing a latch array into multiple banks as in FIG. 2 increases with the number of banks. This benefit is offset, however, by the cost of the added delay through the muxes. The LBRAM 30 of FIG. 2 with 2 banks 34A and 34B can use simple 2:1 muxes to couple the bit lines 40 of the bank 34A to the corresponding bit lines 44 of the bank 34B. When more banks are used, however, the mux function must be implemented with more complicated muxes such as 4:1 or 8:1 muxes, or with several levels of 2:1 muxes. In either case, the mux delay is increased when many banks are used. For example, using one logic technology it was determined that for LBRAMs the cost of the mux delay can exceed the benefit of the bit line transition time reduction if the latch array is divided into more than 16 banks. It was also determined that the fastest read access time is typically obtained if only 4 banks are used.

For example, assume an LBRAM like the LBRAM 30 of FIG. 2 with 16 banks. Also assume the muxing function is 17:1 to accommodate the bit lines of the 16 banks and the test mode. The muxing logic can be implemented in a single stage cell, or using a number of stages of 2:1 muxes. A disadvantage of a single stage cell is that the bit lines of all the 16 banks must be routed to the cell, and some may be quite long. A disadvantage of using the stages of 2:1 muxes is that each stage adds extra delay. For the 16 banks and the 17:1 muxing function, 5 stages of 2:1 muxes are required (4 stages to mux the bit lines of the 16 banks, and an additional 2:1 mux stage for the test mode).

Figure 3:
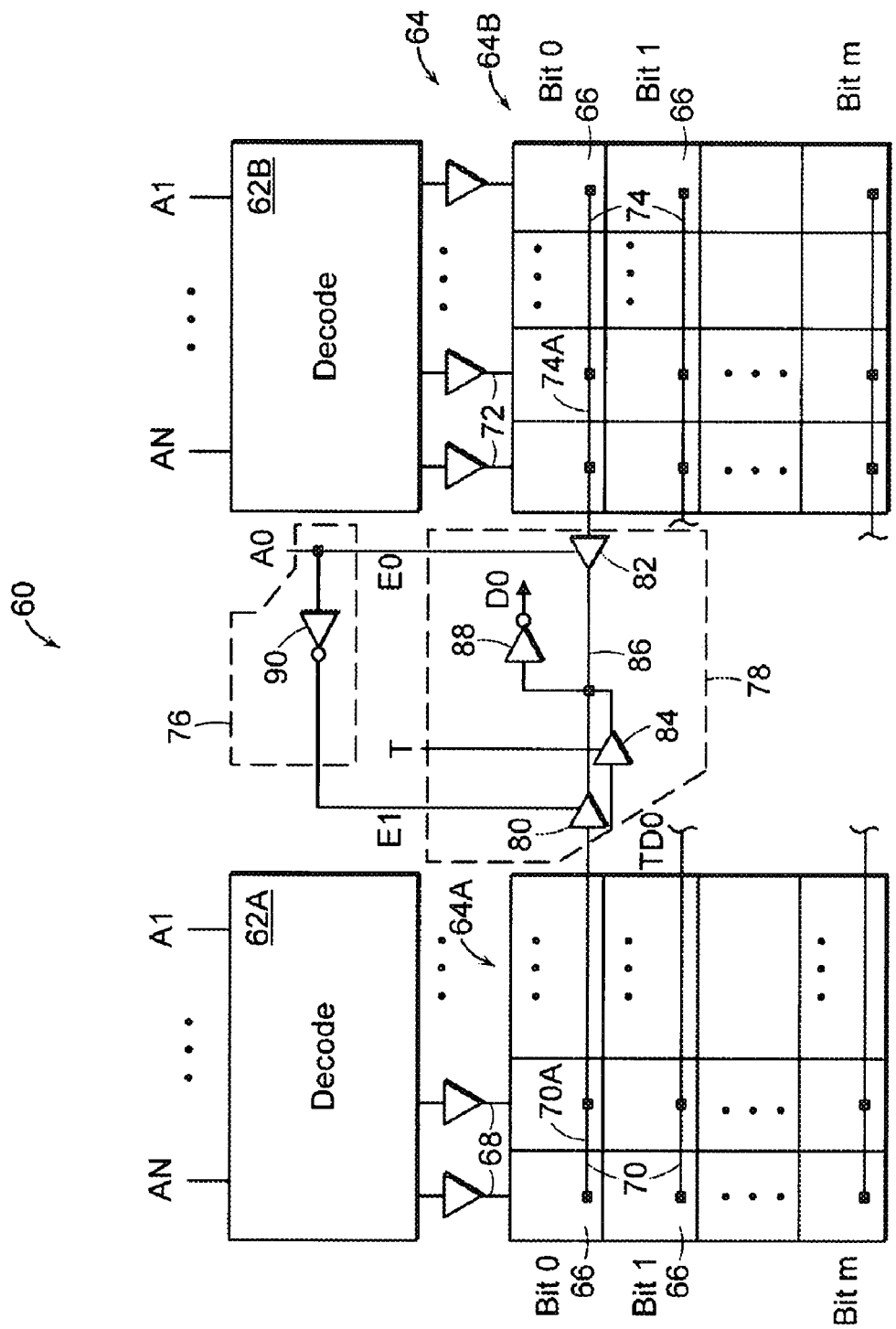
FIG. 3 is a diagram of one embodiment of an LBRAM having a latch array divided into 2 banks according to a tri-state banking architecture.

FIG. 3 is a diagram of one embodiment of a $2^n \times m$ LBRAM 60 having a latch array 64 divided into 2 banks 64A and 64B, wherein a shorter read access time is achieved by implementing bit line signal selection logic using tri-state buffers. Each of the banks 64A and 64B includes a two-dimensional array of latch cells 66, wherein each of the latch cells 66 includes a latch. The bank 64A has $2^{n-1}$ word lines 68 and m bit lines (Bit 0-m) 70. The similar bank 64B also has $2^{n-1}$ word lines 72 and m bit lines (Bit 0-m) 74. The LBRAM 60 has 2 decode units 62A and 62B, each receiving the (n−1) highest-ordered bits of the n-bit address signal AN . . . A1.

The latch cells 66 of each of the banks 64A and 64B are grouped by bit number in rows, and by word number in columns. Each of the latch cells 66 in each row of the bank 64A has an output connected to a corresponding one of the bit lines 70, and each of the latch cells 66 in each row of the bank 64B has an output connected to a corresponding one of the bit lines 74. Each of the latch cells 66 in each column of the bank 64A is activated when the corresponding one of the word lines 68 is activated, and drives the corresponding one of the bit lines 70 with a data value stored by the latch. Similarly, each of the latch cells 66 in each column of the bank 64B is activated when the corresponding one of the word lines 72 is activated, and drives the corresponding one of the bit lines 74 with a data value stored by the latch.

The decode unit 62A is coupled to the $2^{n-1}$ word lines 68 of the bank 64A, and the decode unit 62B is coupled to the $2^{n-1}$ word lines 72 of the bank 64B. The decode unit 62A activates the word lines 68 of the bank 64A according to the (n−1) highest-ordered bits of the n-bit address signal A, and the decode unit 62B activates the word lines 72 of the bank 64B according to the (n−1) highest-ordered bits of the n-bit address signal A. Although a separate decode unit is required for each of the banks 64A and 64B, each of the decode units 62A and 62B decodes only half of the total number of words in the LBRAM 60.

In the embodiment of FIG. 3, the LBRAM 60 includes enable signal generation logic 76 coupled to each of m selection logic units. One of the m selection logic units is shown in FIG. 3 and labeled 78. All of the m selection logic units are structured and operate similarly. The enable signal generation logic 76 receives the lowest-ordered bit A0 of the n-bit address signal A, and uses the bit A0 to produce 2 enable signals E0 and E1.

In the embodiment of FIG. 3, the selection logic unit 78 includes 2 tri-state buffers 80 and 82, an optional tri-state buffer 84, a tri-state bit line 86, and an inverter gate (i.e., inverter) 88. The tri-state buffer 80 has an input node coupled to the bit line 70A of the bank 64A, an enable node coupled to receive the enable signal E1, and an output node coupled to the tri-state bit line 86. The tri-state buffer 82 has an input node coupled to the bit line 74A of the bank 64B, an enable node coupled to receive the enable signal E0, and an output node coupled to the tri-state bit line 86. The optional tri-state buffer 84, included in the embodiment of FIG. 3 to facilitate the test mode, has an input node coupled to receive the bit TD0 of the test data signal TD, an enable node coupled to receive the test signal T, and an output node coupled to the tri-state bit line 86. The inverter 88 has an input node coupled to the tri-state bit line 86, and produces the logical complement of a logic level on the tri-state bit line 86 as an output signal "D0" at an output node. The output signal D0 is indicative of a data value stored in the latch array 64 and accessed via the address signal A.

In the embodiment of FIG. 3, the enable signals E1 and E0 and the test signal T are active high, meaning they are active or asserted when a high logic level (i.e., a logic 1 level), and inactive or deasserted when a low logic level (i.e., a logic 0 level). In general, the tri-state buffer 80 drives the tri-state bit line 86 to a logic level on the bit line 70A when the enable signal E1 is active (when the address bit A0 is a logic 0 and T is inactive). Although not directly shown in FIG. 3, implicit in signal E1 is that E1 is active when A0 is inactive and signal T is inactive. Similarly, the tri-state buffer 82 drives the tri-state bit line 86 to a logic level on the bit line 74A when the enable signal E0 is active (when the address bit A0 is a logic 1 and T is inactive), and the tri-state buffer 84 drives the tri-state bit line 86 to a logic level of the received bit TD0 of the test data signal TD when the test signal T is active. Also not directly shown in FIG. 3, signal E0 is active when A0 is active and signal T is inactive.

In the embodiment of FIG. 3, the enable signal generation logic 76 produces the lowest-ordered bit A0 of the n-bit address signal A as the enable signal E0. The enable signal generation logic 76 includes an inverter 90 having an input node coupled to receive the lowest-ordered bit A0 of the n-bit address signal A. The inverter 90 produces the logical complement of the bit A0 as the enable signal E1 at an output node.

When the test signal T is active or asserted, the selection logic unit 78 produces the logical complement of the corresponding bit TD0 of the test data signal TD at the output node as the output signal D0. When the test signal T is inactive or deasserted, the selection logic unit 78 produces either the logical complement of a signal on the corresponding bit line 70A of the bank 64A, or the logical complement of a signal on the corresponding bit line 74A of the bank 64B, as the output signal D0 dependent upon a logic value of the address bit A0.

It is noted that in the LBRAM embodiments of FIGS. 2 and 3, any of the address bits can be used to select between data provided by the multiple banks via bit lines. In the LBRAM 10 of FIG. 2, the highest-ordered address bit is used to select between data provided by the multiple banks. In the LBRAM 60 of FIG. 3, the lowest-ordered address bit is advantageously used to select between data provided by the multiple banks as the sizes of the banks can be made equal. As this may not be readily apparent, an explanation follows.

In the embodiment of FIG. 3, the LBRAM 60 has $2^n$ words (i.e., the number of words in the LBRAM 60 is a power of 2), and each of the decode units 62A and 62B receives the highest-ordered address bits AN, A(N−1) . . . A1. In other embodiments of the LBRAM 60, however, the number of words may not a power of 2. In this situation, using the lowest-ordered address bit to select between data provided by the multiple banks results in equally sized banks. For example, assume the LBRAM 60 is a 6×m memory containing 6 words, and the latch array 64 is divided into 2 banks as in FIG. 3. Three address bits A2, A1, and A0 are needed to access the 6 words, and the 6 words in the LBRAM 60 are accessed at addresses 000, 001, 010, 011, 100, and 101. Accessing latch cells at addresses 110 and 111 is not recommended as they may provide indeterminate data depending on the implementation.

If the highest-ordered address bit A2 is used to select between data provided by the banks 64A and 64B as in FIG. 3, and address bits A1 and A0 are provided to each of the decode units 62A and 62B, then data at addresses 000, 001, 010, and 011 is stored in the bank 64A, and is selected when address bit A2 is a logic 0. The data at addresses 100 and 101 is stored in the bank 64B, and is selected when the address bit A2 is a logic 1. As a result, the bank 64A is a 4×m bank, and the bank 64B is a 2×m bank.

If, on the other hand, the lowest-ordered address bit A0 is used to select between data provided by the banks 64A and 64B as in FIG. 3, and address bits A2 and A1 are provided to each of the decode units 62A and 62B, then data at addresses 000, 010, 100 is stored in the bank 64A, and is selected when address bit A0 is a logic 0. The data at addresses 001, 011, and 101 is stored in the bank 64B, and is selected when the address bit A0 is a logic 1. The banks 64A and 64B are advantageously equally sized 3×m banks.

Using the tri-state banking architecture of FIG. 3, larger numbers of banks can be implemented by simply connecting a tri-state buffer between a bit line of each bank and a corresponding tri-state bit line. For example, a 16-bank version can be implemented with 17 tri-state buffers having output nodes connected to each tri-state bit line. In this situation, the performance is significantly better than with the 5 mux stages required for the mux banking architecture of FIG. 2. The main advantage of the tri-state banking architecture of FIG. 3 over the mux banking architecture of FIG. 2 is that time delays for additional mux stages are replaced by a single tri-state buffer delay. (It is noted that this advantage is somewhat offset with the increased loading on each tri-state bit line as more tri-state buffers are connected.)

In general, the LBRAM 60 of FIG. 3 includes a $2^n$×m latch array 64 divided to form p banks, wherein n, m, and p are integers, and n≧1, m≧1, and p≧2. Each of the p banks comprises ($2^{n-1}$×m) latch cells each configured to store data, $2^{n-k}$ word lines where k=$\log_2(p)$, and m bit lines. The LBRAM 60 also includes p decode units each coupled to the $2^{n-k}$ word lines of a corresponding one of the p banks. Each of the p decode units is adapted to receive the highest-ordered (n−k) bits of an n-bit address signal and to activate one of the $2^{n-k}$ word lines of the corresponding one of the p banks dependent upon the highest-ordered (n−k) bits of the address signal. The LBRAM 60 also includes enable signal generation logic adapted to receive the lowest-ordered k bits of the n-bit address signal and to generate p enable signals dependent upon the lowest-ordered k bits of the address signal.

In the embodiment of FIG. 3, the LBRAM 60 also includes a first set of m tri-state buffers each having an input node coupled to a different one of the m bit lines of one of the p banks, an enable node coupled to receive one of the p enable signals, and an output node coupled to a different one of m tri-state bit lines. The LBRAM 60 also includes a second set of m tri-state buffers each having an input node coupled to a different one of the m bit lines of another one of the p banks, an enable node coupled to receive one of the p enable signals, and an output node coupled to a different one of the m tri-state bit lines. The LBRAM 60 produces an output signal in response to the n-bit address signal and dependent upon a logic level of the tri-state bit line, wherein the output signal is indicative of a data value stored in the $2^n$×m latch array and accessed via the n-bit address signal.

Figure 4:
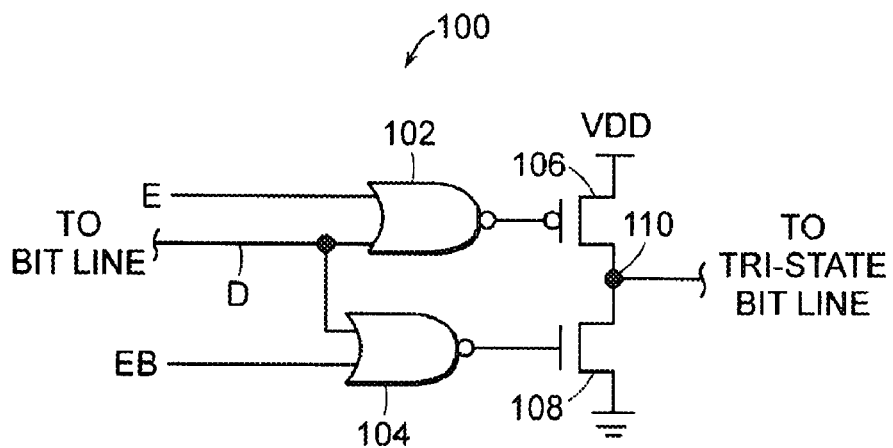
FIG. 4 is a diagram of one embodiment of a tri-state buffer that can be used to form tri-state buffers of the LBRAM of FIG. 3 to improve the performance of the LBRAM.

FIG. 4 is a diagram of one embodiment of a tri-state buffer 100 that can be used to form the tri-state buffers 80, 82, and/or 84 of the LBRAM 60 of FIG. 3 to improve the performance of the LBRAM 60. In the embodiment of FIG. 4, the tri-state buffer 100 includes a NAND gate 102, a NOR gate 104, a p-channel metal oxide semiconductor (PMOS) transistor 106, and an n-channel metal oxide semiconductor (NMOS) transistor 108. One input node of the NAND gate 102 is coupled to receive an enable signal E, and another input node of the NAND gate 102 is coupled to a bit line of a corresponding bank of a latch array and receives a data signal D from the corresponding bank. An output node of the NAND gate 102 is coupled to a gate terminal of the PMOS transistor 106.

The NOR gate 104 also has an input node coupled to the bit line of the bank of the latch array that also receives the data signal D. Another input node of the NOR gate 104 is coupled to receive the logical complement of the enable signal E, labeled EB in FIG. 4. An output node of the NOR gate 104 is coupled to a gate terminal of the NMOS transistor 108.

The PMOS transistor 106 and the NMOS transistor 108 are coupled in series between a positive power supply voltage VDD and a common ground power supply voltage. The PMOS transistor 106 has a source terminal coupled to VDD and a drain terminal coupled to an output node 110 of the tri-state buffer 100. The NMOS transistor 108 has a drain terminal coupled to the output node 110 and a source terminal coupled to the common ground power supply voltage. The output node 110 is coupled to a tri-state bit line corresponding to the bit lines of the bank of the latch array.

In the LBRAM 60 of FIG. 3, all of the m tri-state buffers associated with the bank 64A receive the enable signal E1, and all of the m tri-state buffers associated with the bank 64B receive the enable signal E0. A single inverter can be use to invert the enable signal E1, and another inverter can be used to invert the enable signal E0. The inverted enable signal E1 can be provided to the m tri-state buffers associated with the bank 64A, and the inverted enable signal E0 can be provided to the m tri-state buffers associated with the bank 64B. The main advantage of using the tri-state buffer 100 is that the area and width of the tri-state buffer 100 is reduced over other known tri-state buffer implementations. The decreased width of the tri-state buffer 100 allows banks of latch arrays to be placed closer together as less space is needed. Use of the tri-state buffer 100 has a positive impact on performance due to reduced wire lengths of the tri-state bit lines.

The read access times and die areas of selected LBRAM configurations were computed for both the mux banking architecture of FIG. 2 and the tri-state banking architecture of FIG. 3. The results are summarized in Tables 1 and 2 below.

TABLE 1

Read Access Times For Several LBRAM Configurations

| | Read Access Time (ns) | | |
|---|---|---|---|
| Configuration | Mux Banking | Tri-state Banking | % difference |
| 1 | 1.70 | 1.33 | −21.76% |
| 2 | 1.67 | 1.28 | −23.35% |
| 3 | 1.69 | 1.37 | −18.93% |
| 4 | 2.11 | 1.48 | −29.86% |
| 5 | 2.10 | 1.48 | −29.52% |
| 6 | 2.18 | 1.51 | −30.73% |
| 7 | 1.14 | 0.79 | −30.70% |
| 8 | 1.13 | 0.80 | −29.20% |
| 9 | 1.17 | 0.85 | −27.35% |
| 10 | 1.40 | 0.94 | −32.86% |
| 11 | 1.42 | 0.93 | −34.51% |
| 12 | 1.46 | 1.00 | −31.51% |

TABLE 2

Die Areas For Several LBRAM Configurations

| | Area (sq. μm) | | |
|---|---|---|---|
| Configuration | Mux Banking | Tri-state Banking | % difference |
| 1 | 33590.41 | 42287.24 | 25.89% |
| 2 | 78686.94 | 113845.72 | 44.68% |
| 3 | 120442.98 | 145445.84 | 20.76% |
| 4 | 65732.82 | 80741.79 | 22.83% |
| 5 | 155378.19 | 187830.91 | 20.89% |
| 6 | 227357.94 | 279621.57 | 22.99% |
| 7 | 42492.99 | 56943.88 | 34.01% |
| 8 | 96177.07 | 126285.12 | 31.30% |
| 9 | 146707.92 | 164166.12 | 11.90% |
| 10 | 80632.19 | 95756.82 | 18.76% |
| 11 | 175460.77 | 212361.07 | 21.03% |
| 12 | 267646.78 | 314124.77 | 17.37% |

For each of the architectures, the number of banks in an LBRAM was chosen to give the best performance. For the mux banking architecture of FIG. 2, 2 or 4 banks usually gave the best performance. For the tri-state banking architecture of FIG. 3, 8 or 16 banks usually gave the best performance. The data in Tables 1 and 2 show that while the tri-state banking architecture of FIG. 3 reduces read access time by 20-35%, that performance increase comes at a cost of a 20-35% increase in die area. Table 1 shows that the tri-state banking architecture of FIG. 3 is the only LBRAM architecture capable of read access times of less than 1 nanosecond (ns).

A concern with any tri-state implementation like the tri-state banking architecture of FIG. 3 is buffer contention. If two tri-state buffers driving the same tri-state bit line are enabled at the same time, a large power draw could occur which may cause voltage droop (IVD) problems in the LBRAM or for nearby circuitry. In the tri-state banking architecture of FIG. 3, each tri-state bit line is coupled to an output node of one tri-state buffer from each bank, and is driven by only one tri-state buffer at any given time. Which tri-state buffer drives the tri-state bit line is determined by the enable signals provided to the enable nodes of the tri-state buffers. The enable signals are generated by the enable signal generation logic 76 (see FIG. 3). Switching between tri-state buffers driving the tri-state bit line is an issue as there could be some overlap between the enable signals. The timing of the enable signals is preferably controlled such that there is no overlap.

Figure 5:
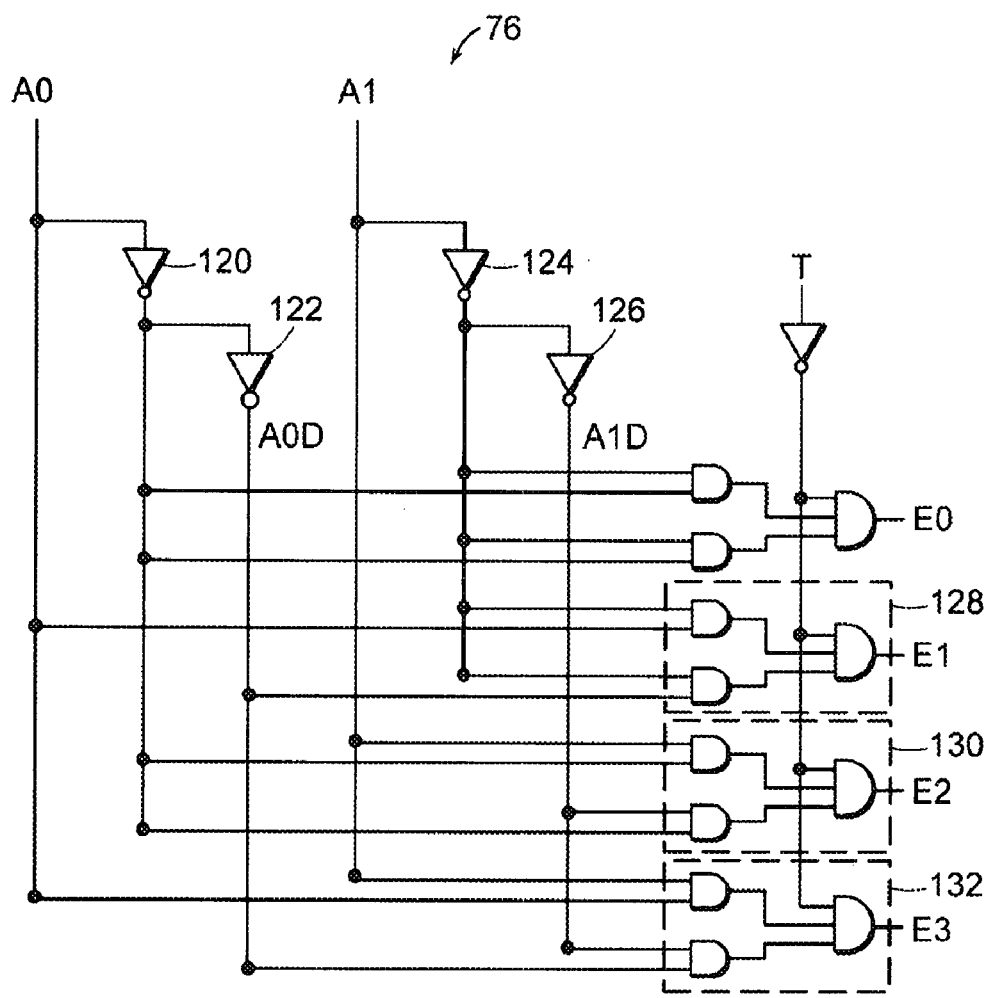
FIG. 5 is a diagram of one embodiment of enable signal generation logic of the LBRAM of FIG. 3 wherein the latch array of the LBRAM is divided into 4 banks.

FIG. 5 is a diagram of one embodiment of the enable signal generation logic 76 of the LBRAM 60 of FIG. 3 wherein the latch array 64 of the LBRAM 60 is divided into 4 banks. In the embodiment of FIG. 5, the enable signal generation logic 76 receives the lowest-ordered address bits A1 and A0, and uses the address bits A1 and A0 to generate 4 enable signals E0, E1, E2, and E3. Each of the enable signals E0, E1, E2, and E3 is applied to the enable nodes of the tri-state buffers coupled between the bit lines of one of the banks of the latch array 64 and a corresponding one of the tri-state bit lines.

In the embodiment of FIG. 5, the enable signals E0, E1, E2, and E3 and the test signal T are active high, meaning they are active or asserted when the high logic level (i.e., the logic 1 level), and inactive or deasserted when the low logic level (i.e., the logic 0 level). In general, the enable signal generation logic 76 of FIG. 5 generates the enable signals E0, E1, E2, and E3 such that no two of the enable signals E0, E1, E2, and E3 are ever in an active state (i.e., the logic 1 level) simultaneously. More specifically, the enable signal generation logic 76 of FIG. 5 generates the enable signals E0, E1, E2, and E3 such that a period of time occurs between a transition of one of the enable signals E0, E1, E2, and E3 from the active state (i.e., the logic 1 level) to an inactive state (i.e., the logic 0 level) and a subsequent transition of the another one of the enable signals E0, E1, E2, and E3 from the inactive state (i.e., the logic 0 level) to the active state (i.e., the logic 1 level).

In the embodiment of FIG. 5, the enable signal generation logic 76 delays the rising edges of each of the enable signals E0, E1, E2, and E3 by the delay time of one inverter, and does not delay the falling edges of the enable signals E0, E1, E2, and E3. As a result, the enable signal generation logic 76 delays the rising edges of each of the enable signals E0, E1, E2, and E3 such that the period of time occurring between a transition of one of the enable signals E0, E1, E2, and E3 from an active state to an inactive state and a subsequent transition of the another one of the enable signals E0, E1, E2, and E3 from the inactive state to the active state is substantially the delay time of one inverter. For reasons described below, the enable signal generation logic 76 of FIG. 5 preferably generates the enable signals E0, E1, E2, and E3 such that that the period of time occurring between a transition of one of the enable signals E0, E1, E2, and E3 from an active state to an inactive state and a subsequent transition of the another one of the enable signals E0, E1, E2, and E3 from the inactive state to the active state is greater than or equal to about 40 nanoseconds.

In the embodiment of FIG. 5, the enable signal generation logic 76 includes 4 AND gates each producing one of the enable signals E0, E1, E2, and E3. Each of the 4 AND gates has an input node coupled to receive the logical complement of the test signal T described above. When the test signal T is active or asserted (i.e., a logic 1), all 4 of the enable signals E0, E1, E2, and E3 are inactive or deasserted (i.e., a logic 0). When the test signal T is a logic 0, the enable signal generation logic 76 produces the enable signals E0, E1, E2, and E3 dependent upon the address bits A1 and A0.

In the embodiment of FIG. 5, the enable signal generation logic 76 includes an inverter 120 producing the logical complement of the address signal A0, and another inverter 122 in series with the inverter 120 producing a signal A0D that is a delayed version of the address signal A0. The enable signal generation logic 76 of FIG. 5 also includes a third inverter 124 producing the logical complement of the address signal A1, and a fourth inverter 126 in series with the inverter 124 producing a signal A1D that is a delayed version of the address signal A1.

The enable signal generation logic 76 of FIG. 5 includes AND logic 128 that receives both the address signal A0 and the delayed version A0D at input nodes, and logically ANDs the A0 and A0D along with other signals to produce the enable signal E1. AND logic 130 receives both the address signal A1 and the delayed version A1D at input nodes, and logically ANDs the signals A1 and A1D along with other signals to produce the enable signal E2. AND logic 132 receives the address signals A0 and A1 and the respective delayed versions A0D and A1D at input nodes, and logically ANDs the signals A0, A1, A0D, and A1D, along with the logical complement of the test signal T, to produce the enable signal E3. As a result, the enable signal generation logic 76 generates the enable signals E0, E1, E2, and E3 such that transitions of the enable signals E0, E1, E2, and E3 from the inactive state to the active state are delayed by a period of time that is the essentially the delay time of the inverters 122 and 126.

Figure 6:
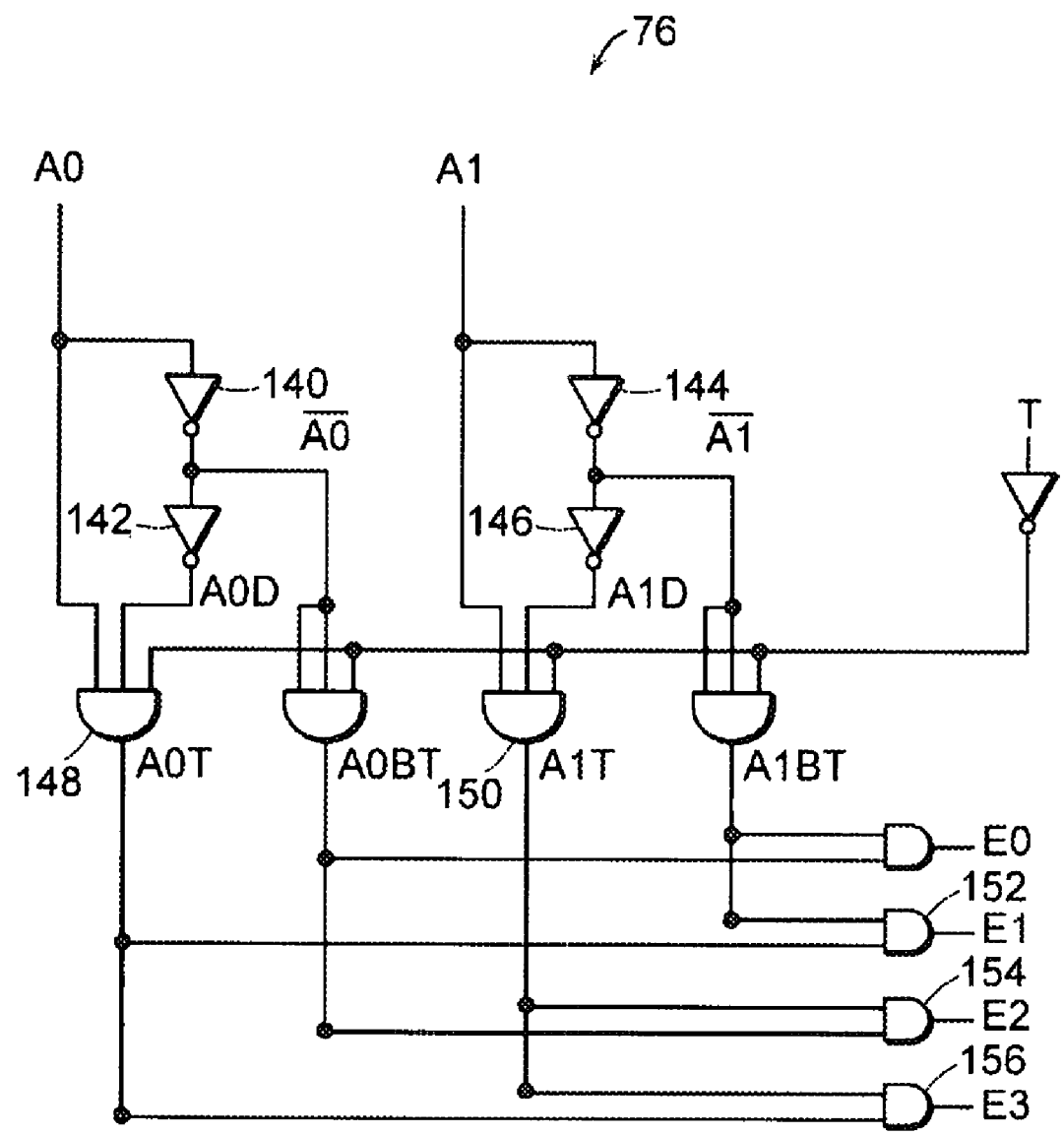
FIG. 6 is a diagram of another embodiment of the enable signal generation logic of FIG. 5 having fewer logic gates.

FIG. 6 is a diagram of another embodiment of the enable signal generation logic 76 of FIG. 5 having fewer logic gates. As in the embodiment of FIG. 5, the enable signal generation logic 76 of FIG. 6 receives the test signal T described above and produces the enable signals E0, E1, E2, and E3 such that when the test signal T is a logic 1, all 4 of the enable signals E0, E1, E2, and E3 are a logic 0. When the test signal T is a logic 0, the enable signal generation logic 76 of FIG. 6 produces the enable signals E0, E1, E2, and E3 dependent upon the address bits A1 and A0.

In the embodiment of FIG. 6, the enable signal generation logic 76 includes an inverter 140 producing the logical complement of the address signal A0, and another inverter 142 in series with the inverter 140 producing the signal A0D that is the delayed version of the address signal A0. The enable signal generation logic 76 of FIG. 6 also includes a third inverter 144 producing the logical complement of the address signal A1, and a fourth inverter 146 in series with the inverter 144 producing the signal A1D that is the delayed version of the address signal A1.

An AND gate 148 of the enable signal generation logic 76 of FIG. 6 receives both the address signal A0 and the delayed version A0D at input nodes, and logically ANDs the A0 and A0D along with the logical complement of the test signal T to produce an intermediate signal A0T. The complementary or inverted logic from A0T and A1T is shown as A0BT and A1BT, respectively. Another AND gate 150 receives both the address signal A1 and the delayed version A1D at input nodes, and logically ANDs the signals A1 and A1D along with the logical complement of the test signal T to produce another intermediate signal A1T. An AND gate 152 receives the intermediate signal A0T and logically ANDs the intermediate signal A0T with another signal to produce the enable signal E1. Another AND gate 154 receives the intermediate signal A1T and logically ANDs the intermediate signal A1T with another signal to produce the enable signal E2. An AND gate 156 receives the intermediate signals A0T and A1T and logically ANDs the intermediate signals A0T and A1T to produce the enable signal E3. As a result, the enable signal generation logic 76 generates the enable signals E0, E1, E2, and E3 such that transitions of the enable signals E0, E1, E2, and E3 from the inactive state to the active state are delayed by a period of time that is essentially the delay time of the inverters 142 and 146.

Figure 7:
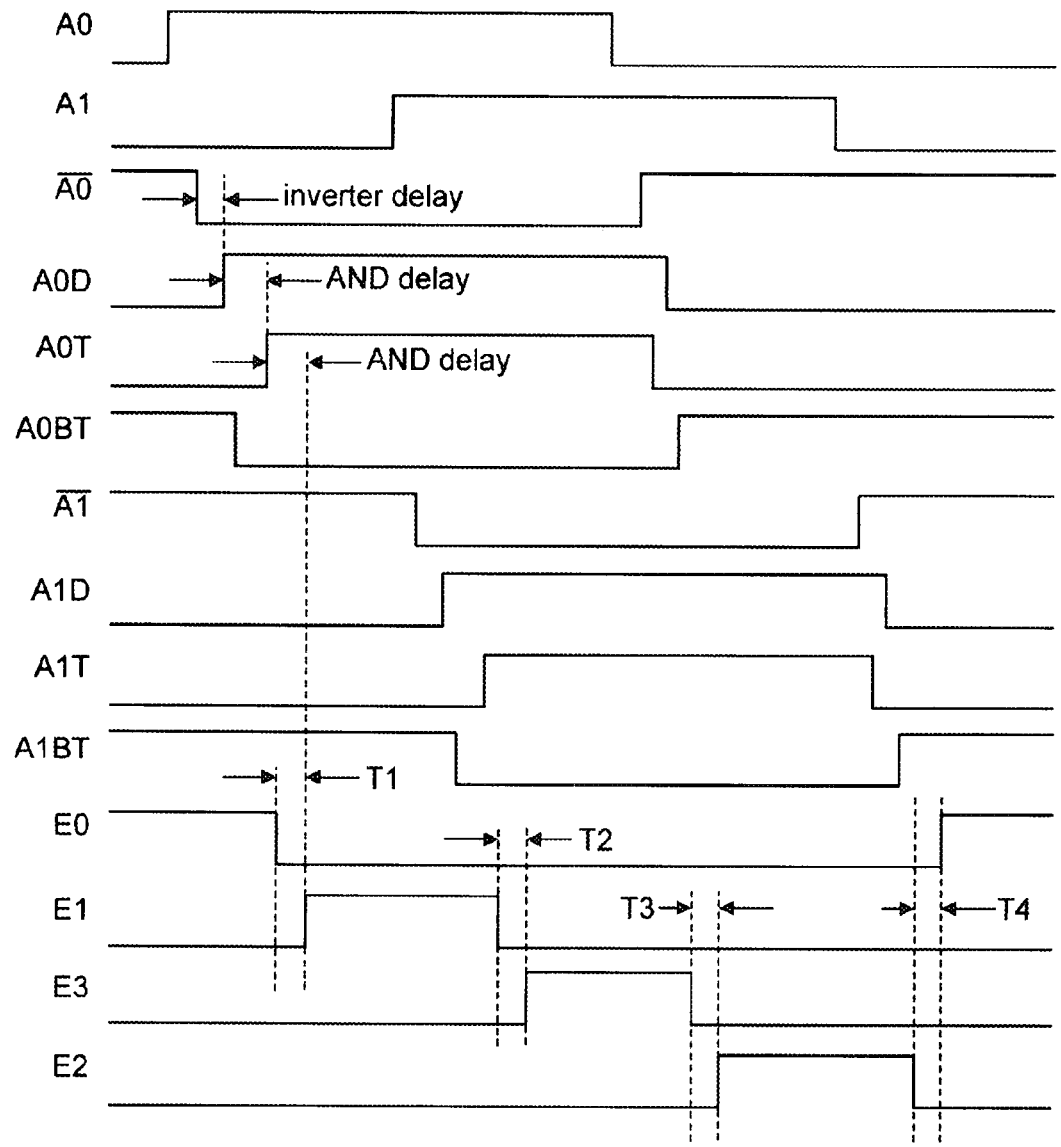
FIG. 7 is a timing diagram for the embodiment of the enable signal generation logic of FIG. 6.

FIG. 7 is a timing diagram for the embodiment of the enable signal generation logic 76 of FIG. 6. In the timing diagram of FIG. 7, a rising edge of a waveform of one of the enable signals E0, E1, E2, and E3 signifies a transition of the enable signal from an inactive state to an active state, and a falling edge of the signal waveform signifies a transition of the enable signal from the active state to the inactive state. Signals A0, A1, $\overline{A0}$, A0D, A0T, A0BT, $\overline{A1}$, A1D, A1T, and A1BT are shown corresponding to FIGS. 5-6. $\overline{A0}$ and $\overline{A1}$ are the inverse of A0 and A1, respectively. In FIG. 7, a period of time T1 exists between a falling edge of the enable signal E0 and a subsequent rising edge of the enable signal E1. A period of time T2 exists between a falling edge of the enable signal E1 and a subsequent rising edge of the enable signal E3, and a period of time T3 exists between a falling edge of the enable signal E3 and a subsequent rising edge of the enable signal E2. A period of time T4 exists between a falling edge of the enable signal E2 and a subsequent rising edge of the enable signal E0. The periods of time T1, T2, T3, and T4 are all substantially equal to the delay time of one inverter. It is noted that in FIG. 7 at most one of the enable signals E0, E1, E2, and E3 is in the active state at any given time. An inverter delay amount is shown for signal $\overline{A0}$, and an AND delay is shown for signals A0D and A0T.

Generally speaking, in the embodiments of FIGS. 5 and 6, the enable signal generation logic 76 produces delayed versions of the address signals A1 and A0, wherein the delayed versions of the address signals A1 and A0 are delayed in time by a delay time. The enable signal generation logic 76 uses the address signals A1 and A0, and the delayed versions of the address signals A1 and A0, to generate the enable signals E0, E1, E2, and E3 such that transitions of the enable signals E0, E1, E2, and E3 from the inactive state to the active state are delayed by a period of time that is a portion of the delay time.

It is noted that the enable signal generation logic 76 of FIGS. 5 and 6 can easily be extended for situations where the latch array 64 of the LBRAM 60 of FIG. 3 is divided into more banks such as, for example, 8 banks or 16 banks.

The enable signal generation logic 76 of FIGS. 5 and 6 was simulated to determine a minimum period of time between one bank enable becoming inactive and another becoming active. The results for several LBRAM configurations are shown in Table 3 below.

TABLE 3

Average Current Draws for Certain Time Periods Between Active Bank Enables For Several LBRAM Configurations

| Configuration | Time Periods Between Active Bank Enables (ns) | Average Current (mA) |
|---|---|---|
| 1 | 84.54 | 5.56 |
| 2 | 101.45 | 1.85 |
| 3 | 36.04 | 57.78 |

The data in Table 3 indicates that the average current draw of an LBRAM increases rapidly when the period of time between a transition of one of the enable signals from an active state to an inactive state and a subsequent transition of the another one of the enable signals from the inactive state to the active state is less than about 40 nanoseconds.

Accordingly, the enable signal generation logic 76 of FIG. 5 preferably generates the enable signals E0, E1, E2, and E3 such that that the period of time occurring between a transition of one of the enable signals E0, E1, E2, and E3 from an active state to an inactive state and a subsequent transition of the another one of the enable signals E0, E1, E2, and E3 from the inactive state to the active state is greater than or equal to 40 nanoseconds.

Further simulations were conducted to determine the average current draws of LBRAMs using the tri-state banking architecture of FIG. 3 as compared to the mux banking architecture of FIG. 2. The results for several LBRAM configurations are shown in Table 4 below.

TABLE 4

Average Current Draws for Several LBRAM Configurations

| | Average current (mA) | | |
|---|---|---|---|
| Configuration | Mux Banking | Tri-state Banking with Contention Avoidance | % Difference |
| 1 | 0.087 | 0.092 | +5.84% |
| 2 | 0.325 | 0.340 | +4.85% |
| 3 | 1.383 | 1.277 | −7.69% |

The results in Table 4 show that there is no excessive power draw during operation of LBRAMs implemented using the tri-state banking architecture of FIG. 3.

LBRAMs implemented using the tri-state banking architecture of FIG. 3 were implemented on a test chip to validate the architecture. The LBRAMs were connected to form oscillating loops with an oscillation period equal to twice the read access time. Several test chip units were manufactured and the oscillation periods measured. The test chip also included a special process monitor circuit measuring the variation in transistor performance caused by manufacturing process variations. This transistor performance measurement is denoted as "Kp." The oscillator loops were simulated, and the simulated oscillation period was adjusted for the Kp measurement for each test chip unit. The following Table 5 summarizes the measurements and simulations:

TABLE 5

Oscillation Periods for Several LBRAM Units

| | Oscillation Period (us) | | |
|---|---|---|---|
| Unit | Measured | Simulated and Kp adjusted | % Difference |
| 1 | 1.18 | 1.15284030 | −2.30% |
| 2 | 1.18 | 1.13625274 | −3.71% |
| 3 | 1.11 | 1.11539029 | +0.49% |

The results in Table 5 show that the expected read access time is matched very closely by the actual performance of LBRAMs that utilize the tri-state banking architecture of FIG. 3. In particular this indicates that the tri-state banking architecture of FIG. 3 has prevented any negative impact of tri-state buffer contention on performance.

Figure 8:
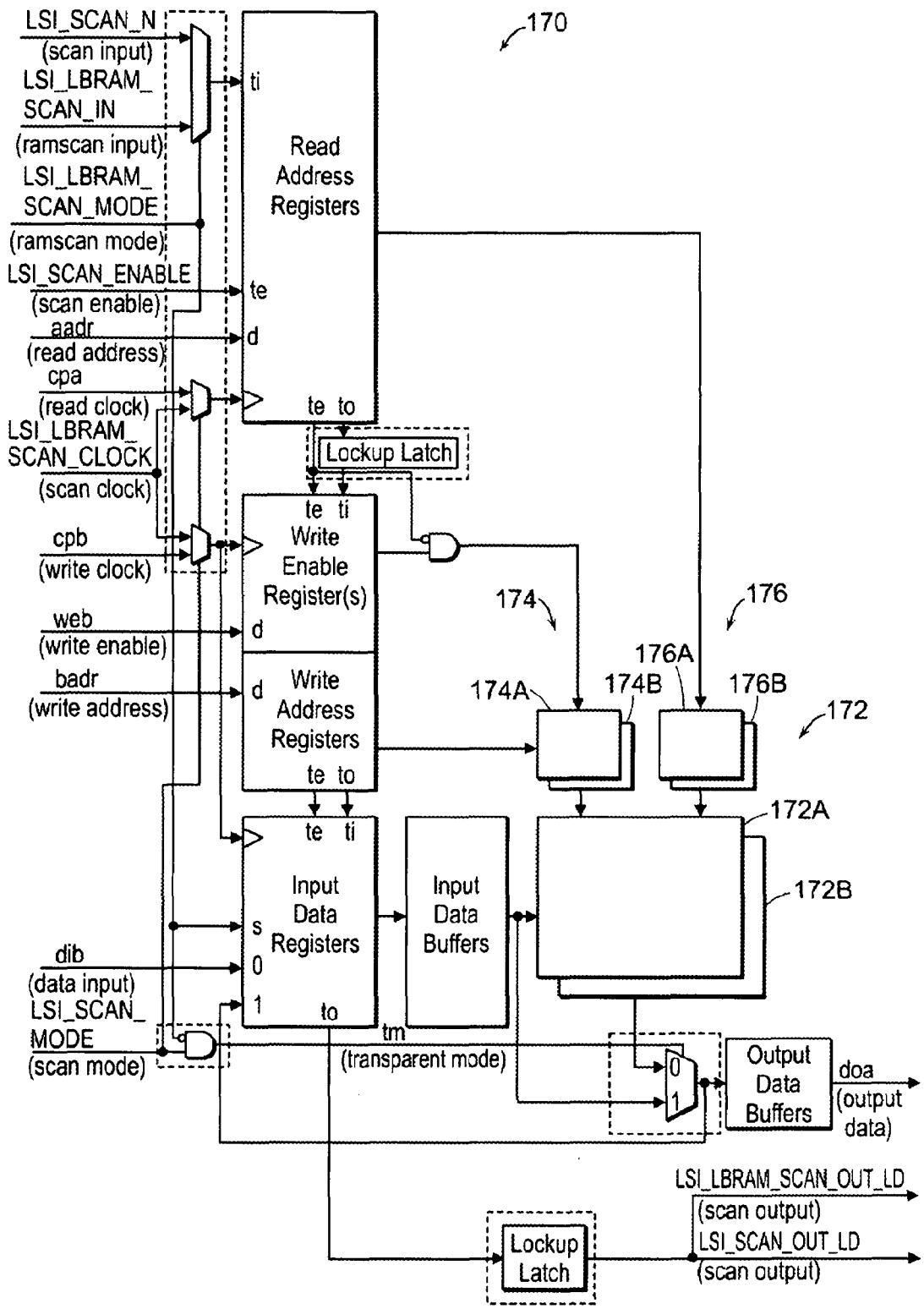
FIG. 8 is a diagram of one embodiment of an LBRAM implemented using the tri-state banking architecture of FIG. 3.

FIG. 8 is a diagram of one embodiment of an LBRAM 170 implemented using the tri-state banking architecture of FIG. 3. The LBRAM 170 includes a latch array 172 divided into multiple banks (e.g., 2, 4, 8, or 16 banks) including banks 172A and 172B. Input signals, LSI SCAN IN (scan input), LSI LBRAM SCAN IN (ramscan input) are forwarded to the testing input (ti), once the testing enable (te) and the delay (d) inputs of the read address register. LSI LBRAM SCAN CLOCK (scan clock) is multiplexed into the clocking input of the Read Address Register or the Write Enable Register via cva (read clock) or cpb (write clock), respectively. The web (write enable) signal is sent to the delay input (d) of the Write Enable Register, whereas the badr (write address) signal is sent to the delay input (d) of the Write Address Register. The dib (data input) is sent to the logic 0 input of the Input Data Register. LSI SCAN MODE (scan mode) input is sent to the select inputs of a pair of multiplexers whose outputs feed the clock inputs to the Read Address Resister and the Write Enable Register. The te and to signals couple inputs and outputs among the registers for testing purposes. The output of the input Data Register is coupled to the input of an Input Data Buffer, whose output is fed into a multiplexer. The multiplexer output feeds an Output Data Buffer for presenting the doa (output data) signal. The testing signal (to) can couple into a Lockup Latch for latching an outPut LSI LBRAM SCAN OUT LD (scan outPut) and LSI SCAN OUT LD (scan output). Enhancements for LBRAM scan testing are shown in phantom. Each of the banks 172A and 172B includes a two-dimensional array of latch cells, wherein each of the latch cells includes a latch. Each of the banks 172A and 172B has multiple word lines and multiple bit lines. The latch cells of each of the banks 172A and 172B are grouped by bit number in rows, and by word number in columns. Each of the latch cells in each row of the bank 172A has an output connected to a corresponding one of the bit lines of the bank 172A, and each of the latch cells in each row of the bank 172B has an output connected to a corresponding one of the bit lines of the bank 172B.

The LBRAM 170 also includes write decode logic 174 divided into multiple write decode units including a write decode unit 174A and a write decode unit 174B. The write decode unit 174A is coupled to the word lines of the bank 172A, and the write decode unit 174B is coupled to the words lines of the bank 172B. During a write operation, each of the write decode units 174A and 174B receives a portion of a write address signal (e.g., the highest-ordered bits of the write address signal), and activates the word lines of the respective banks 172A and 172B according to the portion of a write address signal.

The LBRAM 170 also includes read decode logic 176 divided into multiple read decode units including a read decode unit 176A and a read decode unit 176B. The read decode unit 176A is coupled to the word lines of the bank 172A, and the read decode unit 176B is coupled to the words lines of the bank 174B. During a read operation, each of the read decode units 176A and 176B receives a portion of a read address signal (e.g., the highest-ordered bits of the read address signal), and activates the word lines of the respective banks 172A and 172B according to the portion of a read address signal.

During a read operation, the latch cells in one of the columns of each the banks 172A and 172B are activated when the corresponding word lines are activated. Each activated latch cell drives the corresponding bit line with a data value stored by the latch. Enable signal generation logic of the LBRAM 170 receives one or more of the lowest-ordered bits of the read address signal, and uses the lowest-ordered bits of the read address signal to produce multiple enable signals. The enable signals are provided to each of multiple selection logic units. Each of the selection logic units includes tri-state buffers that select between signals driven on corresponding bit lines, and each selection logic unit produces an output signal that is the logical complement of the selected bit line signal.

It will be appreciated to those skilled in the art having the benefit of this disclosure that this invention is believed to be a novel random access memory (RAM) wherein a latch array is divided into multiple banks. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A memory, comprising:
   a pair of bit lines addressable within a respective first and second banks of storage cells by a first portion of an address;
   an enable signal generation logic adapted to produce a pair of enable signals upon receiving a second portion of the address; and
   a pair of tri-state buffers coupled to receive respective said pair of bit lines and respective said pair of enable signals, and produce an output from the memory depending on a logic state of the pair of enable signals.

2. The memory as recited in claim 1, wherein each of the storage cells comprise a latch.

3. The memory as recited in claim 1, wherein the second portion of the address comprises at least one lesser significant bit or greater significant bit, and wherein the first portion of the address comprises all bits of the address greater than or less than, respectively, said at least one lesser significant bit or said at least one greater significant bit.

4. A random access memory, comprising:
   a plurality of banks including a first bank and a second bank of latch storage cells, wherein the first bank has a first bit line and the second bank has a second bit line;
   enable signal generation logic adapted to receive a portion of an address signal and configured to generate a first and second enable signals dependent upon the portion of the address signal;
   a first tri-state buffer coupled to receive the first bit line and the first enable signal;
   a second tri-state buffer coupled to receive the second bit line and the second enable signal; and
   wherein the first and second tri-state buffers each comprise a tri-state output coupled to one another and configured to produce an output from the memory depending on the address signal and the first and second enable signals.

5. The random access memory as recited in claim 4, wherein the output signal is indicative of a data value stored in the latch cells and accessed via the address signal.

6. The random access memory as recited in claim 4, wherein the address signal comprises an ordered set of bits, and wherein the enable signal generation logic is adapted to receive one or more of the lowest ordered bits of the address signal and to generate the first and second enable signals dependent upon the one or more of the lowest ordered bits of the address signal.

7. The random access memory as recited in claim 4, wherein the random access memory comprises a latch array divided to form the plurality of banks.

8. The random access memory as recited in claim 4, wherein the first tri-state buffer drives the tri-state output to a logic level on the first bit line when the first enable signal is active, and wherein the second tri-state buffer drives the tri-state output to a logic level on the second bit line when the second enable signal is active.

9. The random access memory as recited in claim 4, wherein the first tri-state buffer is coupled to receive a logical complement of the first enable signal, and wherein the second tri-state buffer is coupled to receive a logical complement of the second enable signal.

10. The random access memory as recited in claim 4, wherein the random access memory comprises a $2^n \times m$ latch array divided to form p banks, wherein $n \geq 1$, $m \geq 1$, and $p \geq 2$.

11. The random access memory as recited in claim 10, wherein each of the p banks comprises $2^{n-k}$ word lines where $k=\log_2(p)$, and wherein the random access memory further comprises p decode units each coupled to the $2^{n-k}$ word lines of a corresponding one of the p banks.

12. The random access memory as recited in claim 11, wherein the address signal comprises an ordered set of n bits, and wherein each of the p decode units is adapted to receive the highest-ordered (n−k) bits of the address signal and to activate one of the $2^{n-k}$ word lines of the corresponding one of the p banks dependent upon the highest-ordered (n−k) bits of the address signal.

13. The random access memory as recited in claim 10, wherein the first bank has m bit lines, and the first bit line is one of the m bit lines of the first bank.

14. The random access memory as recited in claim 13, wherein the second bank has m bit lines, and the second bit line is one of the m bit lines of the second bank.

15. The random access memory as recited in claim 14, wherein the random access memory comprises a first set of m tri-state buffers, wherein the first tri-state buffer is one of the first set of m tri-state buffers.

16. The random access memory as recited in claim 15, wherein the random access memory comprises a second set of m tri-state buffers, wherein the second tri-state buffer is one of the second set of m tri-state buffers.

17. The random access memory as recited in claim 16, wherein the address signal comprises an ordered set of n bits, and wherein the enable signal generation logic is adapted to receive the lowest-ordered $\log_2(p)$ bits of the address signal to generate p enable signals dependent upon the lowest-ordered $\log_2(p)$ bits of the address signal, and wherein the first and second enable signals are part of the p enable signals.

18. A random access memory, comprising:
   a $2^n \times m$ latch array divided to form p banks, wherein $n \geq 1$, $m \geq 1$, and $p \geq 2$, and wherein each of the p banks comprises $(2^{n-1} \cdot m)$ latch cells each configured to store data, $2^{n-k}$ word lines where $k=\log_2(p)$, and m bit lines;
   p decode units each coupled to the $2^{n-k}$ word lines of a corresponding one of the p banks, wherein each of the p decode units is adapted to receive (n−k) bits of an n-bit address signal and to activate one of the $2^{n-k}$ word lines of the corresponding one of the p banks dependent upon the (n−k) bits of the address signal;
   enable signal generation logic adapted to receive k bits of the n-bit address signal and to generate p enable signals dependent upon the k bits of the address signal;
   a first set of m tri-state buffers each having an input node coupled to a different one of the m bit lines of one of the p banks, an enable node coupled to receive a one of the p enable signals, and an output node coupled to a different one of m tri-state bit lines;
   a second set of m tri-state buffers each having an input node coupled to a different one of the m bit lines of another one of the p banks, an enable node coupled to receive one of the p enable signals, and an output node coupled to a different one of the m tri-state bit lines; and wherein the random access memory produces an output signal in response to the n-bit address signal and dependent upon a logic level of the tri-state bit line.

19. The random access memory as recited in claim 18, wherein the output signal is indicative of a data value stored in the $2^n \times m$ latch array and accessed via the n-bit address signal.

20. The random access memory as recited in claim 18, wherein each of the p decode units is adapted to receive the highest-ordered (n–k) bits of the n-bit address signal and to activate one of the $2^{n-k}$ word lines of the corresponding one of the p banks dependent upon the highest-ordered (n–k) bits of the address signal, and wherein the enable signal generation logic is adapted to receive the lowest-ordered k bits of the n-bit address signal and to generate p enable signals dependent upon the lowest-ordered k bits of the address signal.

* * * * *